(12) United States Patent
Furuta et al.

(10) Patent No.: US 6,433,548 B1
(45) Date of Patent: Aug. 13, 2002

(54) RF COIL, MAGNETIC RESONANCE SIGNAL MEASURING APPARATUS, AND MAGNETIC RESONANCE IMAGING APPARATUS

(75) Inventors: Osamu Furuta; Eiji Takeda; Yoshiro Udo, all of Tokyo (JP)

(73) Assignee: Medical Systems Global Technology Company, LLC, Waukesha, WI (US)

( * ) Notice: Subject to any disclaimer, the term of this patent is extended or adjusted under 35 U.S.C. 154(b) by 2 days.

(21) Appl. No.: 09/703,300

(22) Filed: Nov. 1, 2000

(30) Foreign Application Priority Data

Nov. 26, 1999 (JP) .............................. 11-335387

(51) Int. Cl.⁷ ................................................ G01V 3/00
(52) U.S. Cl. ........................................ 324/318; 324/322
(58) Field of Search ................................ 324/318, 322, 324/300, 306, 307, 309, 312, 314

(56) References Cited

U.S. PATENT DOCUMENTS

| | | | | |
|---|---|---|---|---|
| 5,370,118 A | * | 12/1994 | Vij et al. ..................... | 324/318 |
| 5,517,120 A | * | 5/1996 | Misic et al. ................. | 324/318 |
| 5,519,321 A | * | 5/1996 | Hagen et al. ................ | 324/311 |
| 5,543,710 A | * | 8/1996 | Jones .......................... | 324/318 |
| 5,583,438 A | * | 12/1996 | Eydelman et al. .......... | 324/319 |

* cited by examiner

Primary Examiner—Louis Arana
(74) Attorney, Agent, or Firm—Moonray Kojima

(57) ABSTRACT

Coils surrounding the forehead of an imaging subject and coils wrapped around the nose elevation for the part from the nose down are provided to effectively obtain an image of a head, and by forming the front surface in a grid shape, openness, brightness and air circulation are improved.

20 Claims, 17 Drawing Sheets

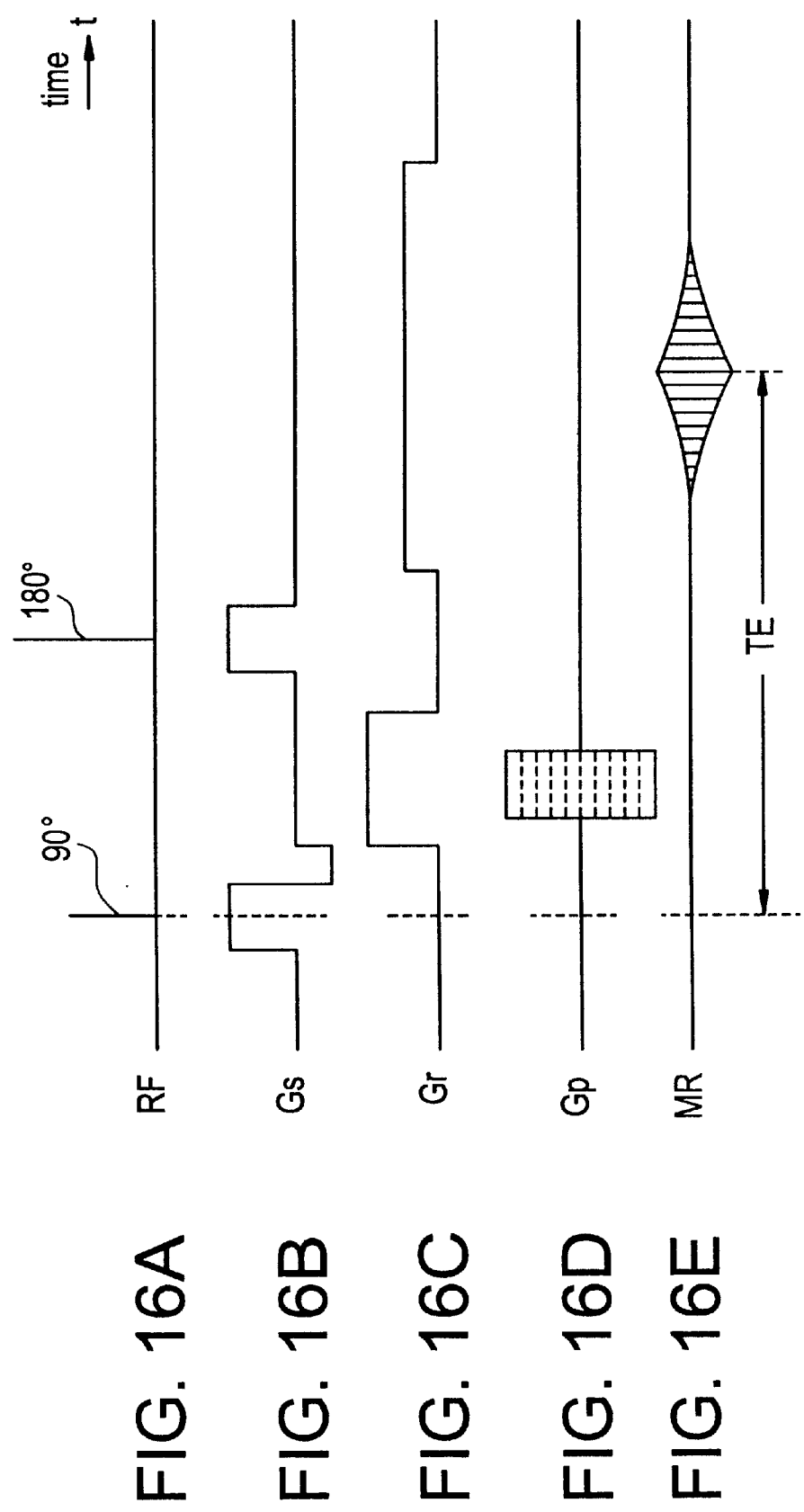

RF COIL, MAGNETIC RESONANCE SIGNAL MEASURING APPARATUS, AND MAGNETIC RESONANCE IMAGING APPARATUS

BACKGROUND OF THE INVENTION

This invention relates to an RF coil (radio frequency coil), to a magnetic resonance signal measuring apparatus and to a magnetic resonance imaging apparatus. In particular, it relates to an RF coil in proximity to and surrounding an imaging subject, to a magnetic resonance signal measuring apparatus using this RF coil, and to a magnetic resonance imaging apparatus using this magnetic resonance signal measuring apparatus.

In a magnetic resonance imaging apparatus, an RF coil is disposed in proximity to an imaging subject, and a magnetic resonance signal is measured at a position as close as possible to an imaging site so as to improve the SNR (signal-to-noise ratio) of the signal.

The RF coil used for imaging the head has a substantially cylindrical shape and accommodates the whole of the head in the internal space of a cylinder. However, if the nose is not to come in contact with the wall, the coil diameter will be too large compared to the effective diameter of the head, and a high SNR will not necessarily be obtained.

SUMMARY OF THE INVENTION

It is therefore object of this invention to provide an RF coil which can effectively image a head, a magnetic resonance signal measuring apparatus using this RF coil, and a magnetic resonance imaging apparatus using this community resonance signal measuring apparatus.

(1) The invention from one aspect to resolve the above problem is an RF coil comprising a plurality of first coil loops having a substantially cylindrical shape and coaxially disposed from one end side to a center part in the axial direction of a space housing an imaging subject, a plurality of second coil loops having a part projecting in a direction effectively perpendicular to the axial direction and coaxially disposed from another end side to the center part, and a supporting frame supporting the first and second coil loops in one piece, whereof at least the other end side in the axial direction is open.

The invention from this aspect uses a combination of two types of coil loop, i.e., a coil loop which has a projecting part in one direction and a coil loop which does not. Consequently, the RF coil fits the forehead and nose which have different diameters, and can accommodate them.

(2) The invention from another aspect to resolve the above problem is an RF coil wherein the first and second coil loops are formed using a rod-shaped conductor whereof parts arranged in the aforesaid direction are not covered by the supporting frame except the parts at the two ends in the axial direction.

In the invention from this aspect, the coil loop part cutting across the face of the imaging subject is a rod-shaped conductor, and as the width per unit cross-section is small, the openness in front of the face is increased.

(3) The invention from another aspect to resolve the above problems is an RF coil as defined in (2), wherein the rod-shaped conductor comprises a transparent coating.

In the invention from this aspect, the coating of the rod-shaped conductor is transparent, so obstruction of the visual field due to the thickness of the coating is reduced. Further, more outside light enters and the interior is bright.

(4) The invention from another aspect to resolve the above problems is an RF coil as defined in any of (1) to (3), wherein the supporting frame comprises an opening in a direction effectively perpendicular to the axial direction and the aforesaid direction.

In the invention from this aspect, the supporting frame is open also in the lateral direction, so openness is high. Further, the permeability to air is improved.

(5) The invention from another aspect to resolve the above problems is an RF coil as defined in any of (1) to (4), wherein a reflecting mirror is attached to the supporting frame.

In the invention from this aspect, a visual field in a predetermined direction is maintained by bending the line of site by the reflecting mirror.

(6) The invention from another aspect to resolve the above problems is an RF coil as defined in (5), wherein the position of the reflecting mirror can be varied in the axial direction.

In the invention from this aspect, the position of the reflecting the mirror is variable, so adaptation to individual differences in imaging subjects can therefore be made.

(7) The invention from another aspect to resolve the above problems is a magnetic resonance signal measuring apparatus, comprising a plurality of first coil loops having a substantially cylindrical shape and coaxially disposed from one end side to a center part in the axial direction of a space housing an imaging subject, a plurality of second coil loops having a part projecting in a direction effectively perpendicular to the axial direction and coaxially disposed from another end side to the center part, a supporting frame supporting the first and second coil loops in one piece, whereof at least the other end side in the axial direction is open, and a magnetic resonance signal measuring means connected to these coil loops.

In the invention from this aspect, a combination of two types of coil loop, i.e., a coil loop which has a projecting part in one direction and a coil loop which does not, is used. Consequently, the RF coil fits the forehead and nose which have different diameters, and can accommodate them. A magnetic resonance signal can be measured with a high SNR by this RF coil.

(8) The invention from another aspect to resolve the above problems is a magnetic resonance imaging apparatus, comprising a static magnetic field forming means which forms a static magnetic field in a space housing an imaging subject, a gradient magnetic field forming means which forms a gradient magnetic field in the space, a high frequency magnetic field forming means which forms a high frequency magnetic field in the space, a plurality of first coil loops having a substantially cylindrical shape and coaxially disposed from one end side to a center part in the axial direction of a space housing an imaging subject, a plurality of second coil loops having a part projecting in a direction effectively perpendicular to the axial direction and coaxially disposed from another end side to the center part, a supporting frame supporting the first and second coil loops in one piece, whereof at least the other end side in the axial direction is open, a magnetic resonance signal measuring means connected to these coil loops, and an image-generating means which generates an image based on the magnetic resonance signal measured by the magnetic resonance signal measuring means.

In the invention from this aspect, a combination of two types of coil loop, i.e., a coil loop which has a projecting part in one direction and a coil loop which does not, is used. Consequently, the RF coil fits the forehead and nose which have different diameters, and can accommodate them. A magnetic resonance signal can be measured with a high SNR by this RF coil, and a high-quality image can be generated based on the measured signal.

According to this invention, an RF coil, magnetic resonance signal measuring apparatus using this RF coil, and magnetic resonance imaging apparatus using this magnetic resonance signal measuring apparatus can be provided.

Further objects and advantages of the present invention will be apparent from the following description of the preferred embodiments of the invention as illustrated in the accompanying drawings.

BRIEF DESCRIPTION OF THE DRAWINGS

FIGS. 16(A)–16(E) are diagrams showing an example of a pulse sequence performed by the apparatus shown in FIG. 1.

DETAILED DESCRIPTION OF THE INVENTION

Figure 1:
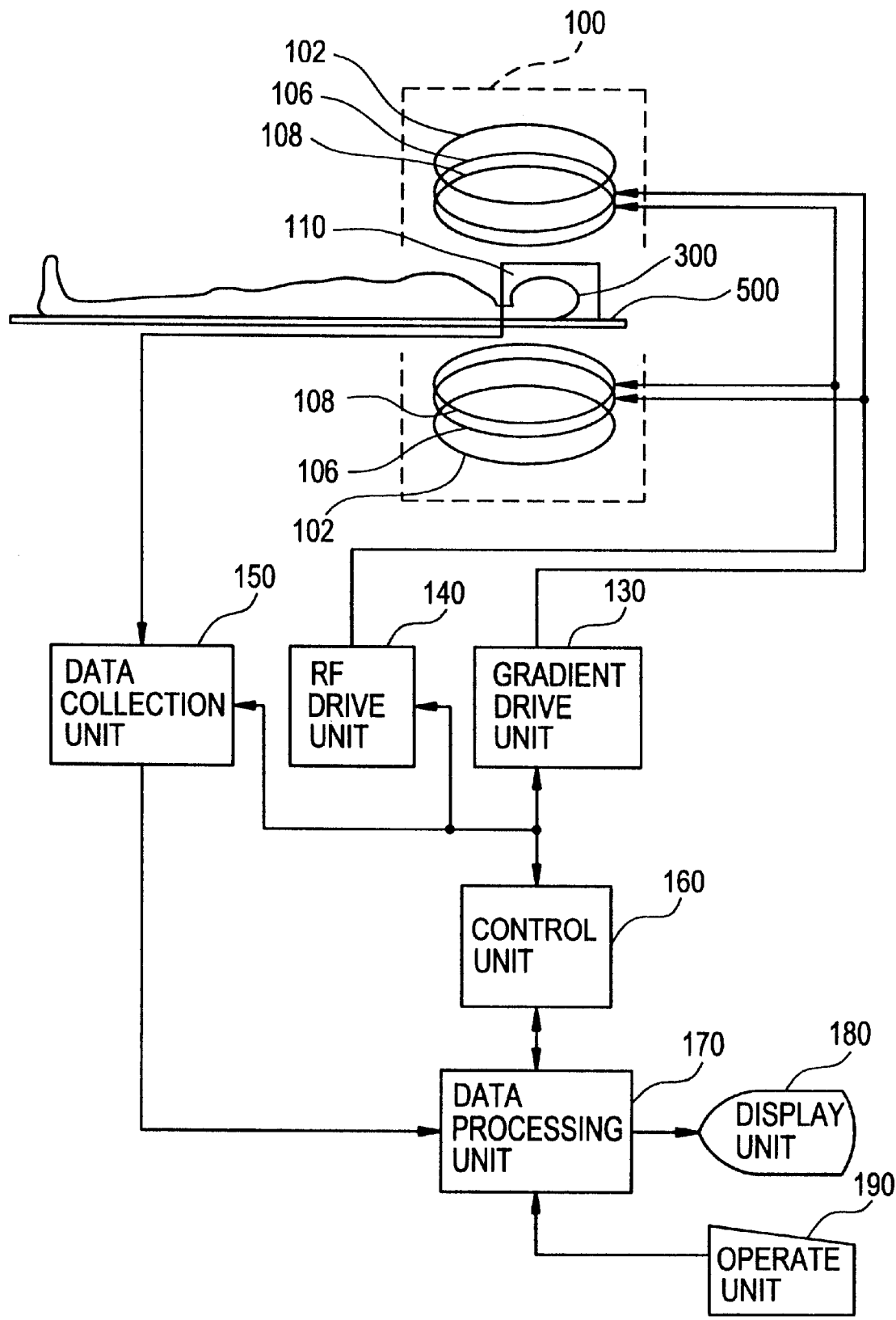
FIG. 1 is a block diagram of an apparatus according to an example of one embodiment of this invention.

Some embodiments of this invention will now be described in detail referring to the appended diagrams. FIG. 1 is a block diagram of a magnetic resonance imaging apparatus. This apparatus is an example of one embodiment of the invention. An example of one embodiment relating to the apparatus of this invention is shown by the construction of this apparatus.

As shown in FIG. 1, this apparatus comprises a magnet system 100. The magnet system 100 comprises main magnetic field magnet parts 102, a gradient coil part 106 and an RF coil unit 108. These main magnetic fields magnet parts 102 and coil parts are arranged in pairs facing each other across a gap. They also have a substantially disk-like shape and are disposed so that they share a center axis. An imaging subject 300 is transported in and out of the internal space of the magnet system 100 on a cradle 500, not shown.

A receiving coil unit 110 is provided in the cradle 500. The receiving coil unit 110 has an essentially cylindrical shape, and is disposed on the upper surface of the cradle 500. The imaging subject 300 is carried in a reclining position with its head inside the envelope of the receiving coil unit 110.

Hereafter, in the receiving coil unit 110, the tip of the head of the imaging subject 300 will be referred to as up, and the neck will be referred to as down. Further, left and right when the imaging subject 300 is viewed from beneath will be referred to as left and right of the receiving coil unit 110.

The receiving coil unit 110 is an example of one form of the RF coil of this invention. One form of the RF coil of this invention is shown by the construction of this coil. The receiving coil unit 110 will be described again later.

The main magnetic field magnet part 102 forms a static magnetic field in the internal space of the magnet system 100. The main magnetic field magnet part 102 is an example of a static magnetic field forming means according to this invention. The direction of the static magnetic field is perpendicular to the body axis of the imaging subject 300. In other words, it forms a perpendicular magnetic field. The main magnetic field magnet part 102 may be constructed using, for example, a permanent magnet or the like. It will of course be understood that it is not limited to a permanent magnet, and may be constructed using a superconducting electromagnet or a permanently conducting electromagnet.

A gradient coil part 106 generates a gradient magnetic field in order to give a gradient to the static magnetic field intensity. The gradient magnetic field which is generated may be of three types, i.e., a slice gradient magnetic field, read-out gradient magnetic field and phase encode gradient magnetic field, and the gradient coil part 106 comprises three gradient coils, not shown, according to these three types of gradient magnetic field.

An RF coil unit 108 transmits an RF excitation signal to excite the spin in the body of the imaging subject 300 in the static magnetic field space. The receiving coil unit 110 receives a magnetic resonance signal generated by the excited spin.

The gradient coil unit 106 is connected to a gradient drive unit 130. The gradient drive unit 130 generates a gradient magnetic field by supplying a drive signal to the gradient coil unit 106. The parts comprising. the gradient coil unit 106 and gradient drive unit 130 are an example of one form of the gradient magnetic field forming means according to this invention. The gradient drive unit 130 comprises three drive circuits, not shown, according to the three gradient coils in the gradient coil unit 106.

An RF drive unit 140 is connected to the RF coil unit 108. The RF drive unit 140 transmits an RF excitation signal by supplying a drive signal to the RF coil unit 108, and excites the spin in the body of the imaging subject 300. The parts comprising the RF coil unit 108 and RF drive unit 140 are an example of one form of the high frequency magnetic field forming means according to this invention.

A data collecting unit 150 is connected to the receiving coil unit 110. The data collecting unit 150 acquires signals received by the receiving coil unit 110, and collects them as digital data.

The parts comprising the receiving coil unit 110 and data collecting unit 150 are an example of one form of the magnetic resonance signal measuring apparatus of the invention. An example of one form relating to the apparatus of this invention is shown by the construction of this measuring apparatus. The data collecting unit 150 is an example of one form of the magnetic resonance signal measuring means according to this invention.

A control unit 160 is connected to the gradient drive unit 130, RF drive unit 140 and data collecting unit 150. The control unit 160 respectively controls the gradient drive unit 130 and data collecting unit 150.

A data processing unit 170 is connected to the output side of the data collecting unit 150. The data processing unit 170 stores data collected from the data collecting unit 150 in a memory, not shown. A data space is formed in the memory. The data space comprises a two-dimensional Fourier space. The data processing unit 170 reconstructs an image of the imaging subject 300 by performing a two-dimensional inverse Fourier transformation on the data in the two-dimensional Fourier space. The data processing unit 170 is an example of one form of the image generating means according to this invention.

The data processing unit 170 is connected to the control unit 160. The data processing unit 170 supervises the control unit 160. A display unit 180 and operating unit 190 are connected to the data processing unit 170. The display unit 180 displays reconstructed images and various information output from the data processing unit 170. The operating unit 190 is controlled by an operator, and inputs various commands and information to the data processing unit 170.

Figure 2:
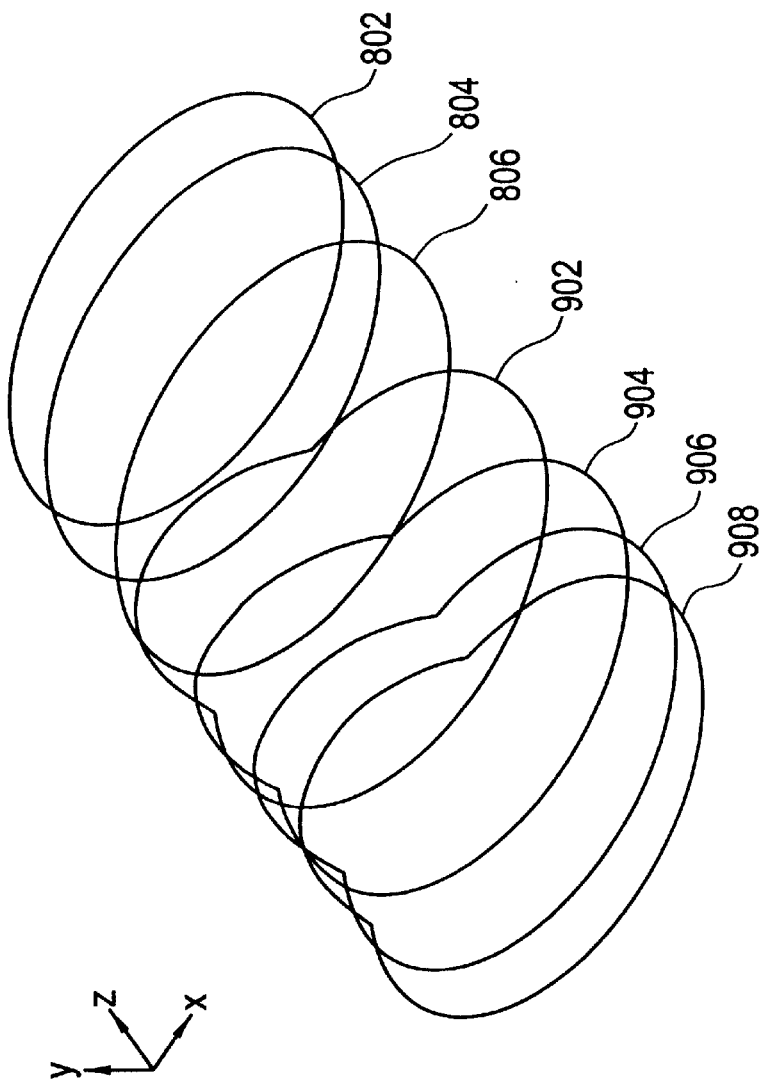
FIG. 2 is a schematic view showing a coil arrangement of the receiving coil unit in the apparatus shown in FIG. 1.

FIG. 2 shows the schematic construction and arrangement of the coil loops in the receiving coil unit 110 by a perspective drawing. In the figure, x, y, z are respectively the left-right direction, front-back direction and top-down direction of the imaging subject 300.

As shown in the figure, the receiving coil unit 110 comprises upper coils 802, 804, 806 and lower coils 902, 904, 906, 908. The upper coils 802, 804, 806 are an example of one form of the plural first coils according to this invention. The lower coils 902, 904, 906, 908 are an example of one form of the plural second coils according to this invention.

The upper coils 802, 804, 806 are all solenoid coils having one turn, and are disposed at a predetermined interval in the z direction. The main sensitivity direction of these coils is the z direction. These coils formed a phased array coil wherein there is effectively no electromagnetic coupling.

Figure 3:
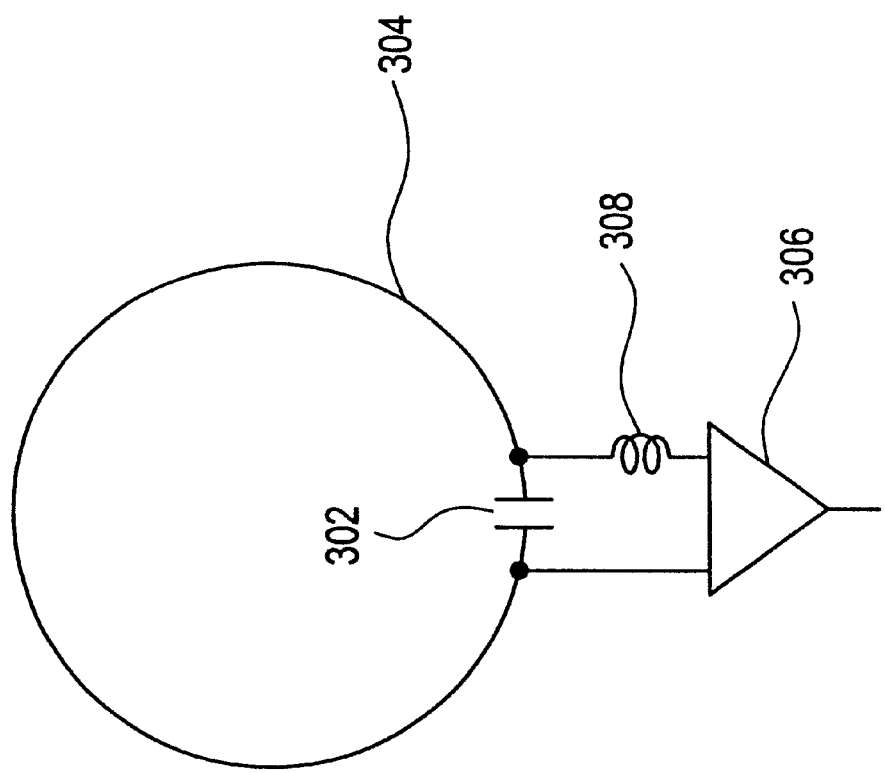
FIG. 3 is a circuit diagram of the coil shown in FIG. 2.

FIG. 3 shows the electrical circuit of a unit coil forming the phased array coil. As shown in the figure, the union coil comprises a capacitor 302 and a conductor 304 connected in series. An input circuit of a preamplifier 306 which amplifies the magnetic resonance signal received by the unit coil is connected via an inductor 308 to both ends of the capacitor 302. The preamplifier 306 is an amplifier for which the input circuit impedance is sufficiently low, i.e., a low input impedance amplifier.

In this unit coil, as the preamplifier 306 is a low input impudence amplifier, an LC parallel circuit is effectively formed by the capacitor 302 and inductor 308. Herein, the resonance frequency of the LC parallel circuit is selected so as the coincide with the frequency of the magnetic resonance signal. As a result, the LC parallel circuit resonates when a magnetic resonance signal is received, and due to the resulting high impedance, the unit coil effectively becomes an open loop.

As the upper coils 802, 804, 806 and lower coils 902, 904, 906, 908 all have this construction, there is effectively no coupling and the situation is equivalent to when the coils are present independently.

The upper coils 802, 804, 806 are provided in a position where they surround the head of the imaging subject 300 around the forehead. The upper coils 802, 804, 806 are shown as three coil loops, but the invention is not limited to this arrangement and any suitable number of coil loops may be used. The length of the upper coils 802, 804, 806 is slightly greater than the circumferential length of the head of the imaging subject at the forehead. This is also for example a length which can be used for the majority of adults who may be subjects.

The lower coils 902, 904, 906, 908 are provided in a position where they surround the head of the imaging subject 300 in the part underneath the nose. The lower coils 902, 904, 906, 908 are shown as four coil loops, but the invention is not limited to this arrangement and any suitable number of coil loops may be used. The lower coils form loops partially extending in the y direction corresponding to the elevation of the nose. The length of the lower coils 902, 904, 906, 908 is slightly greater than the circumferential length of the head of the imaging subject at the nose. This is also for example a length which can be used for the majority of adults who may be subjects.

In this way, in the receiving coil unit 110, the upper coils 802, 804, 806 and the lower coils 902, 904, 906, 908 respectively have shapes and lengths corresponding to imaging sites. In particular, the loop length of the upper coils 802, 804, 806 may be made shorter than that of the lower coils 902, 904, 906, 908 by an unnecessary projection amount for avoiding the nose. Therefore, the distance between the loop and surface of the head can be shortened, and signal reception can be performed with a good SNR.

Figure 4:
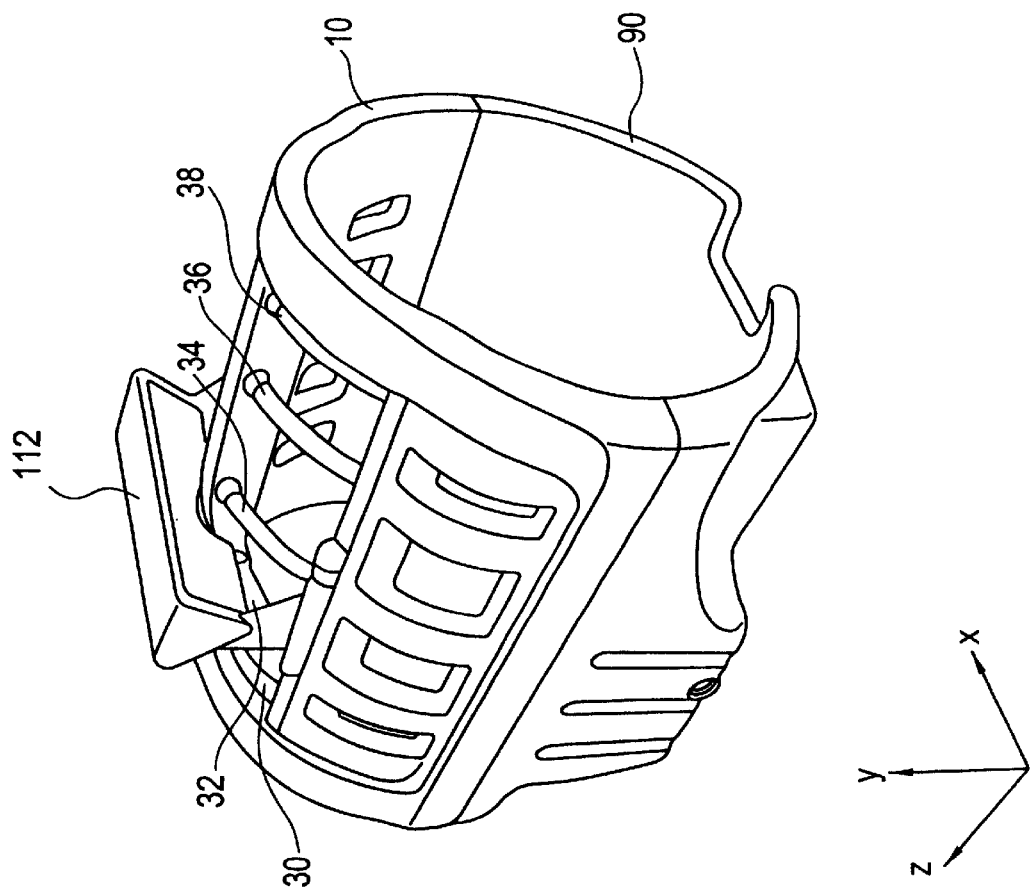
FIG. 4 is a perspective view of the receiving coil unit in the apparatus shown in FIG. 1.
Figure 5:
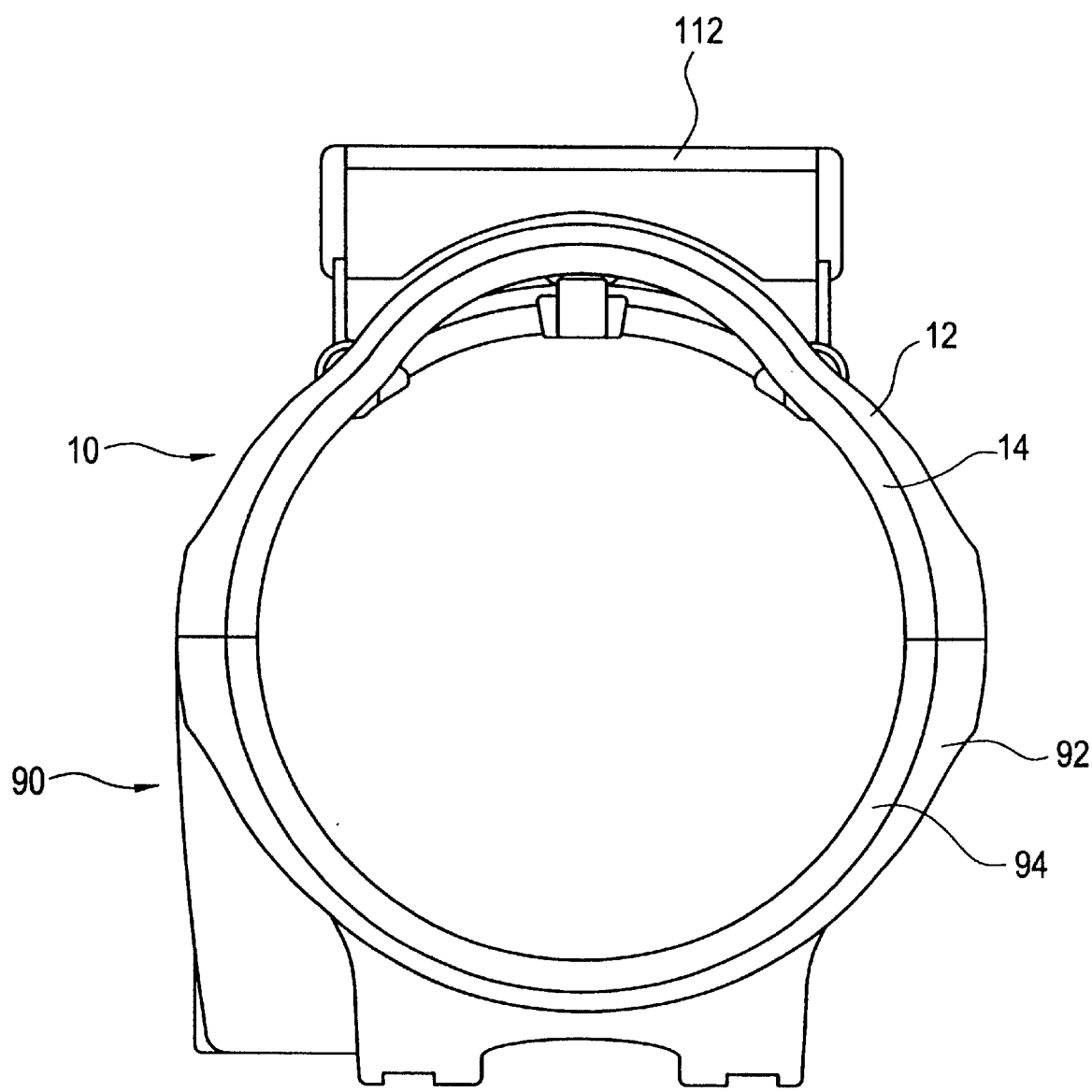
FIG. 5 is a front view of the receiving coil unit in the apparatus shown in FIG. 1.
Figure 6:
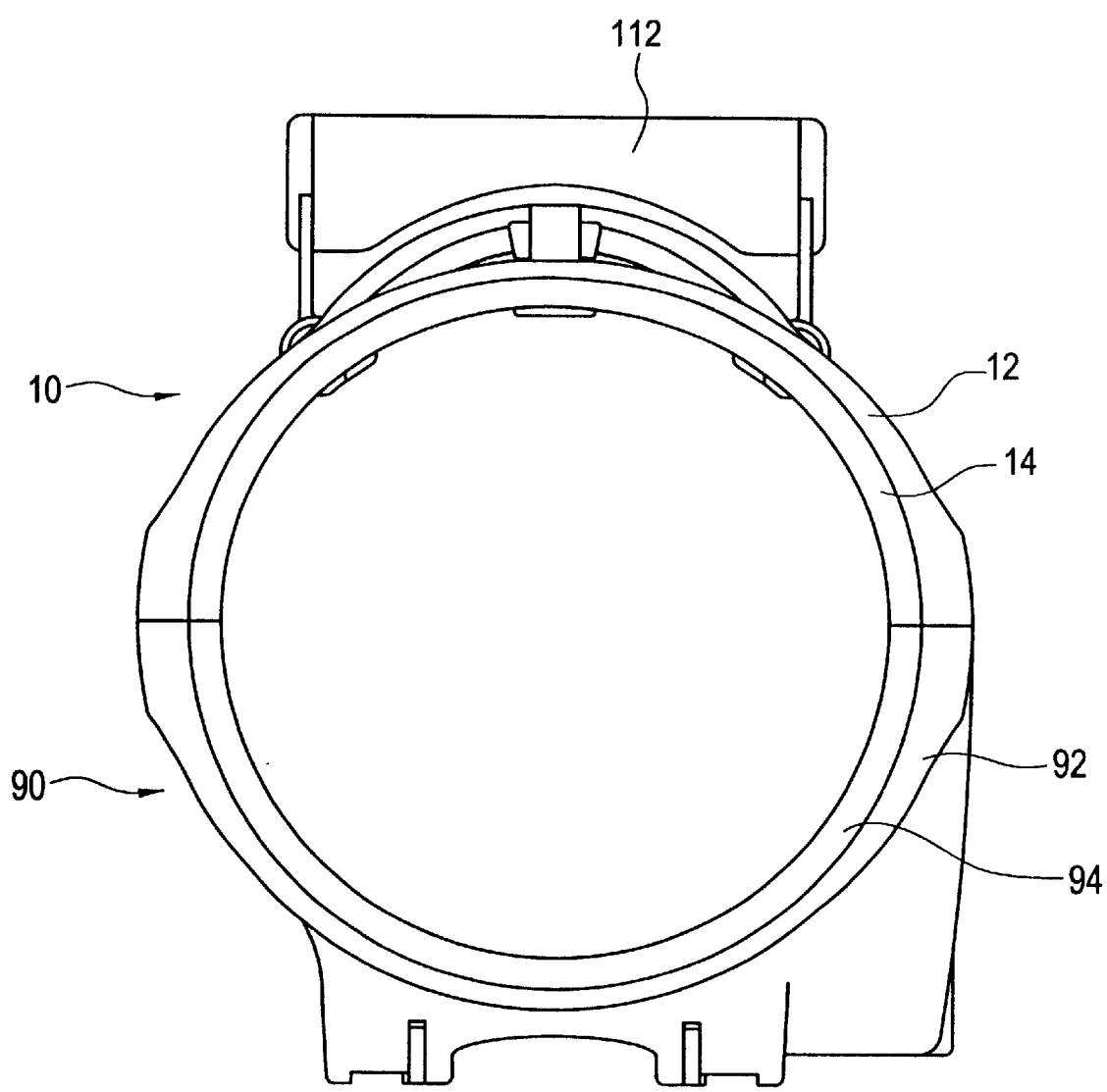
FIG. 6 is a rear view of the receiving coil unit in the apparatus shown in FIG. 1.
Figure 7:
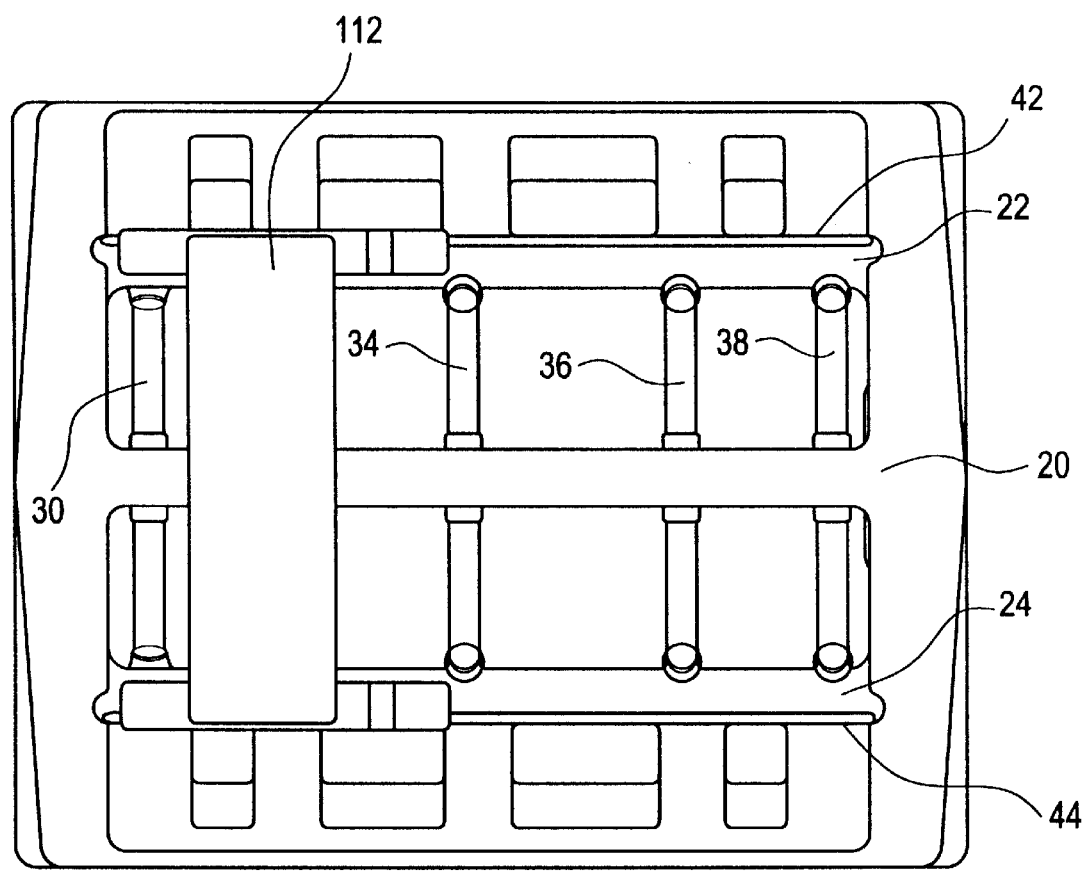
FIG. 7 is a plan view of the receiving coil unit in the apparatus shown in FIG. 1.
Figure 8:
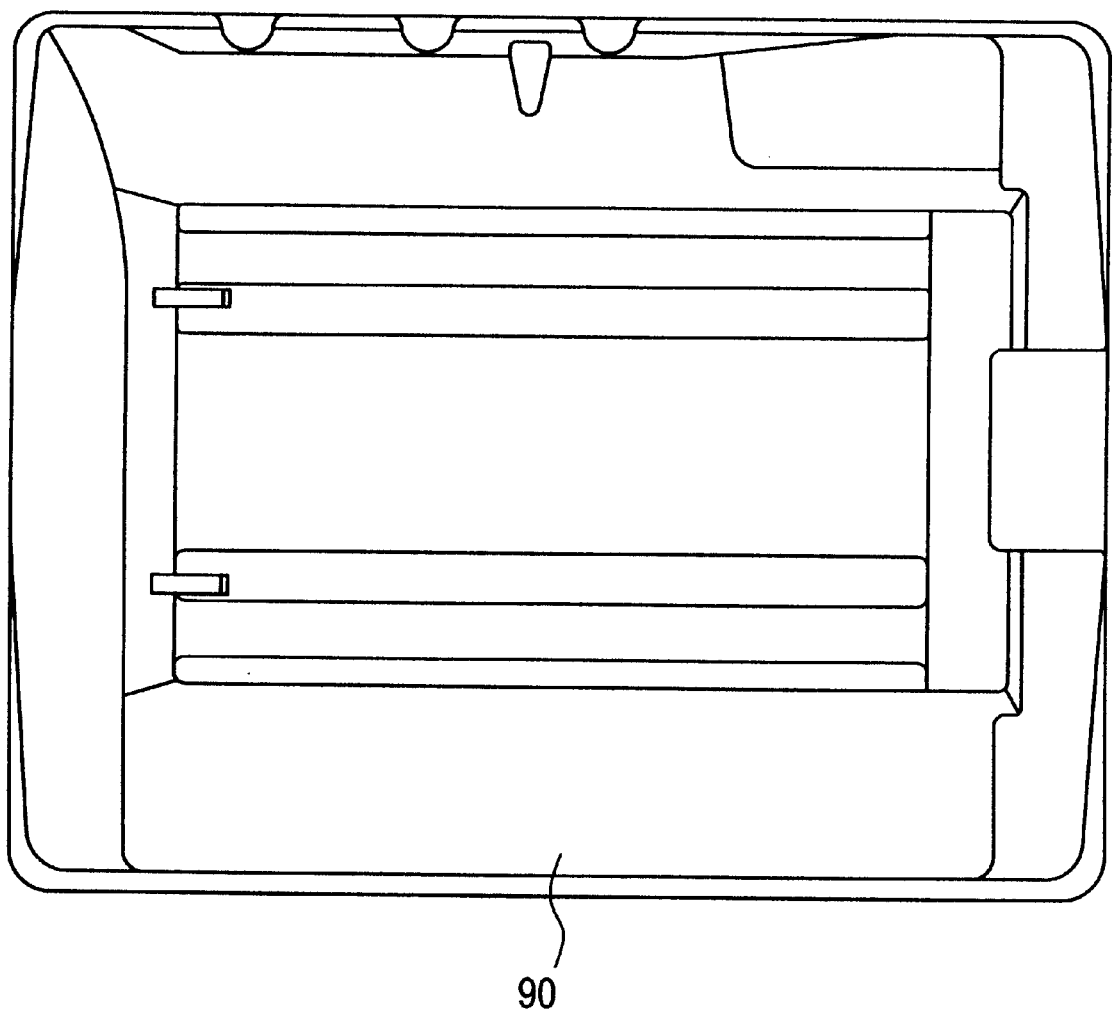
FIG. 8 is a base view of the receiving coil unit in the apparatus shown in FIG. 1.
Figure 9:
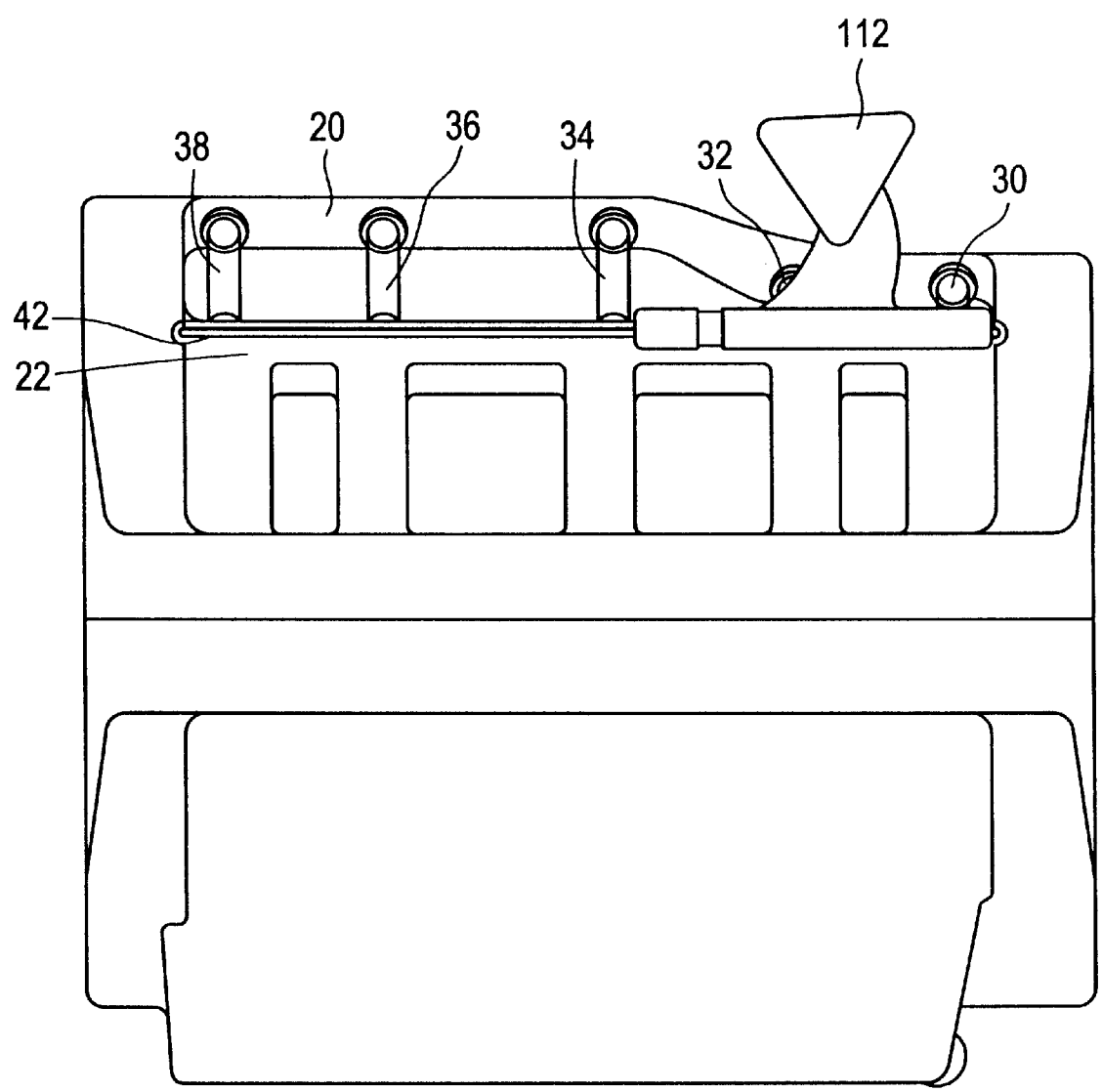
FIG. 9 is a right side view of the receiving coil unit in the apparatus shown in FIG. 1.
Figure 10:
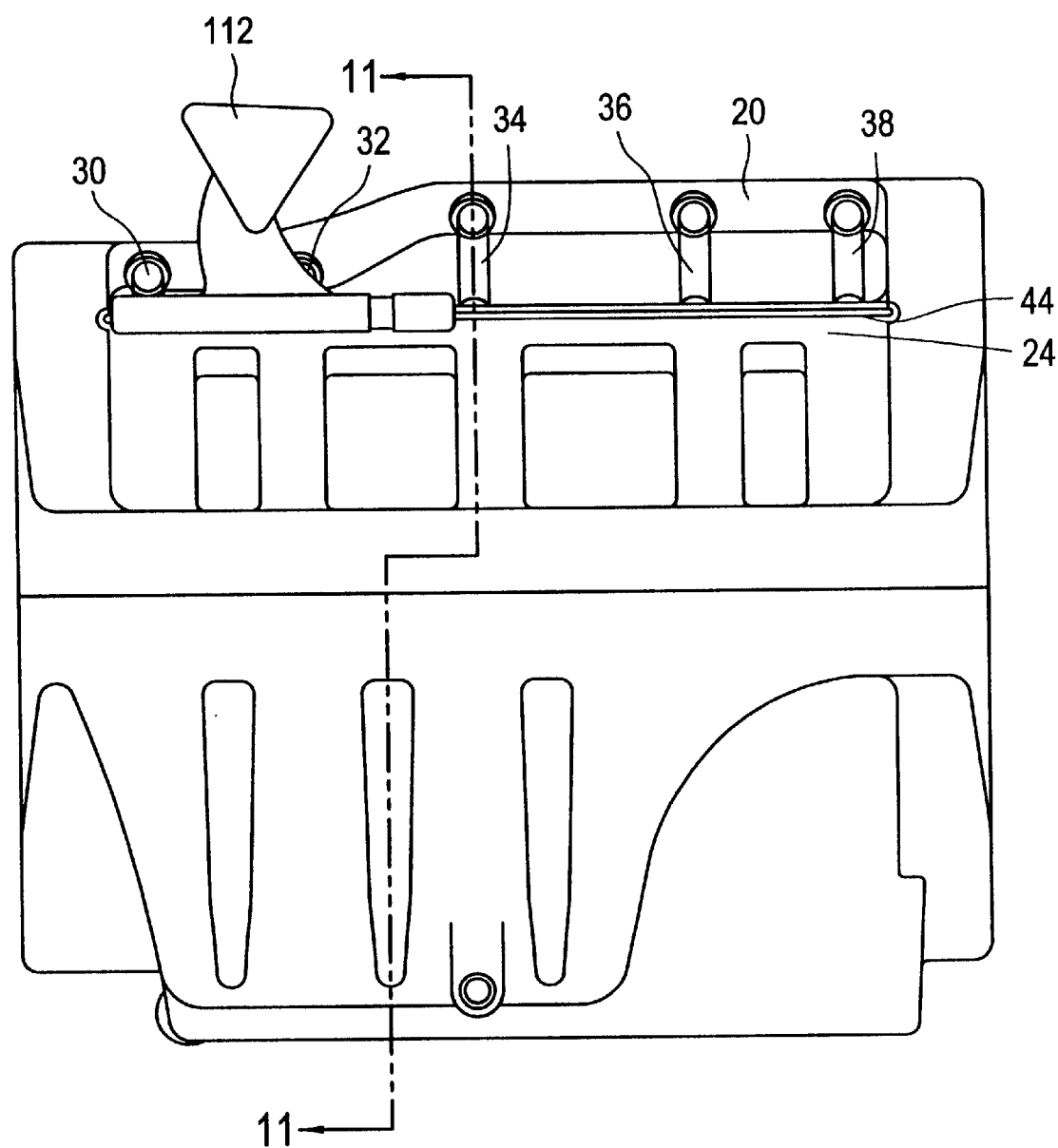
FIG. 10 is a left side view of the receiving coil unit in the apparatus shown in FIG. 1.
Figure 11:
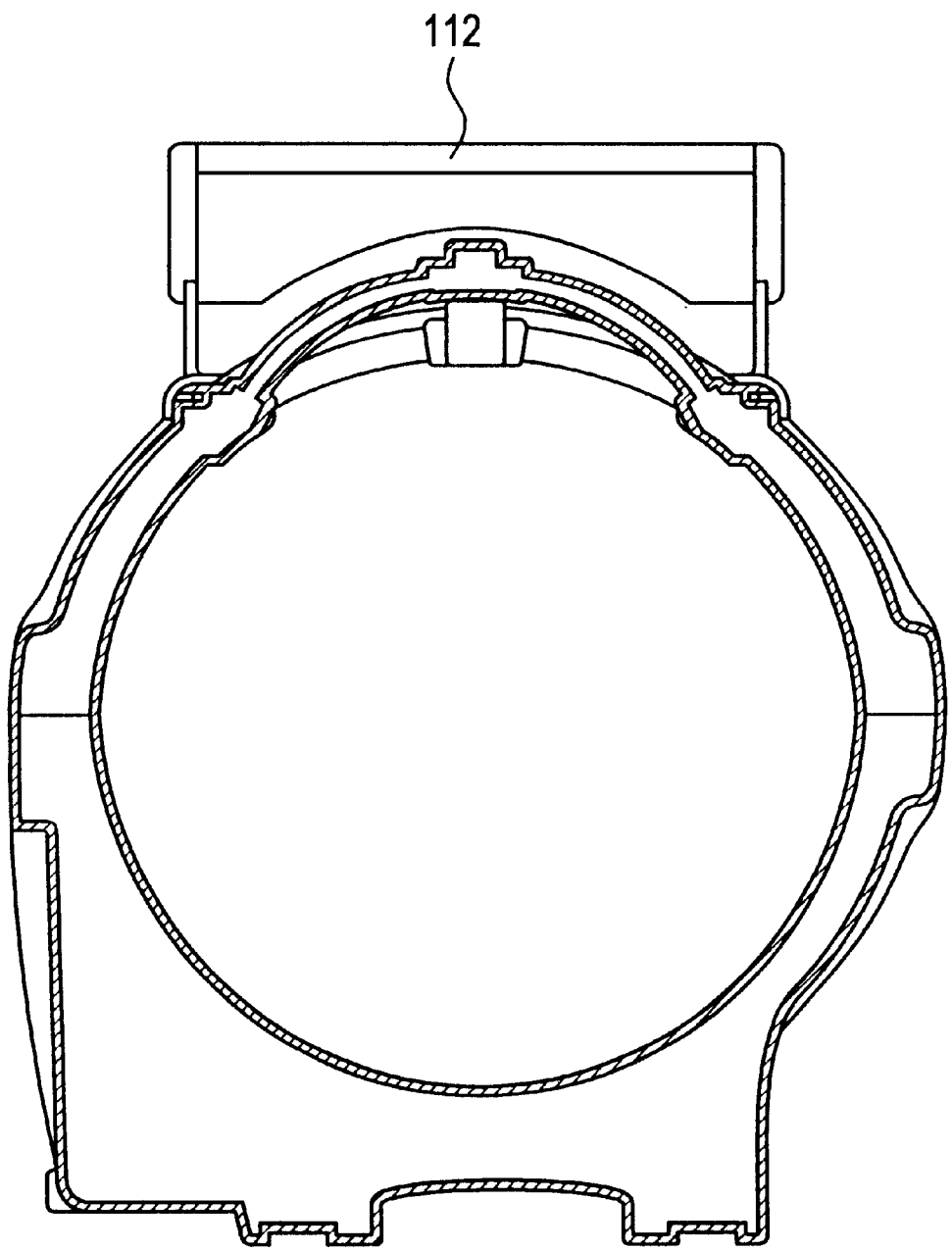
FIG. 11 is a cross-sectional view through AA omitting the internal mechanism of the receiving coil unit in the apparatus shown in FIG. 1.

FIG. 4 to FIG. 10 show the appearance of the receiving coil unit 110. FIG. 4 is a perspective view, FIG. 5 is a front view, FIG. 6 is a rear view, FIG. 7 is a plan view, FIG. 8 is a base view, FIG. 9 is a right side view and FIG. 10 is a left side view. FIG. 11 shows a cross-sectional views through a line A—A omitting the internal mechanism.

As can be seen from these figures, the receiving coil unit 110 takes the form of an envelope having a substantially cylindrical shape except for an attached reflecting mirror 112. The envelope is open at both ends. The envelope is formed by joining a substantially semicircular envelope-shaped front structure 10 and rear structure 90 in a one-piece construction. At the front of the envelope, a part of the circle projects in front following the loop shape of the lower coil 908, as shown by FIG. 5. At the rear of the envelope, the circle follows the loop shape of the upper coil 802, as shown in FIG. 6.

The front structure 10 is a combination of an outer frame 12 and inner frame 14, and the rear structure 90 is a combination of an outer frame 92 and inner frame 94. The outer frames 12, 92 and inner frames 14, 94 are an example of one form of the supporting frame according to this invention. The outer frames 12, 92 and inner frames 14, 94 comprise an insulating material such as plastic. Between these outer frames 12, 92 and inner frames 14, 94, the lower coil 908 is gripped on the front side and the upper coil 802 is gripped on the rear side, respectively. In the lower coil 908 and upper coil 802, a foil-shaped conductor such as for example copper foil or the like is used as the coil conductor.

The front structure 10 is substantially grid-shaped over its whole surface as shown in perspective view (FIG. 4), plan view (FIG. 7) and both side views (FIG. 9, FIG. 10). The grid comprises three vertical grids 20, 22, 24 extending in the axial direction of the cylinder, and five substantially arc-shaped horizontal grids 30, 32, 34, 36, 38 intersecting the vertical grids. There are open spaces between the grids.

The vertical grids 20, 22, 24 form part of the outer frame 12 and inner frame 14. The horizontal grids 30, 32, 34, 36, 38 are divided into foursegments by the vertical grids 20, 22, 24. Of the foursegments, parts belonging to the twosegments on either side form part of the outer frame 12 and inner frame 14. Hereafter, the vertical grid 20 will be referred to also as a central vertical grid, the vertical grid 22 as a right-hand vertical grid, and the vertical grid 24 as a left-hand vertical grid. Likewise, the horizontal grids 30, 32, 34, 36, 38 will also be referred to respectively as a first horizontal grid, second horizontal grid, third horizontal grid, fourth horizontal grid and fifth horizontal grid.

The front halves of the upper coils 804, 806 are respectively sealed inside the first horizontal grid 30 and second horizontal grid 32, and form arcs according to their loop shape. The front halves of the lower coils 902, 904, 906 are respectively sealed inside the third horizontal grid 34, fourth horizontal grid 36 and fifth horizontal grid 38, and form projecting arcs in front of the first horizontal grid 30 and second horizontal grid 32 corresponding to their projecting parts. The central vertical grid 20 therefore also projects in front in the parts intersecting the third horizontal grid 34, fourth horizontal grid 36 and fifth horizontal grid 38. The rear halves of the coils are sealed inside the rear structure 90. Electrical components such as the capacitor, inductor and preamplifier are also sealed inside the rear structure.

Between the central horizontal grid 20 and left and right vertical grids 22, 24, the horizontal grids 30, 32, 34, 36, 38 are all formed for example of a rod-shaped conductor such as copper rod covered by a transparent coating. The coating acts as electrical insulation. In the part sealed inside the outer frame 12 and inner frame 14, it is formed using a foil-shaped conductor such as for example copper foil. If a conducting wire having a diameter of for example approximately 3 mm is used as the rod-shaped conductor, into cross-sectional surface area is equivalent to the cross-sectional surface area of a copper foil of thickness 0.6 mm and width 12.5 mm. The coating of this rod-shaped conductor may conveniently be a transparent plastic tube, i.e., a clear tube, having external dimensions of, for example, approximately 10 mm.

A reflecting mirror 112 is mounted on the left and right vertical grids 22, 24. The reflecting mirror 112 is an example of one form of the reflecting mirror according to this invention.

Figure 12:
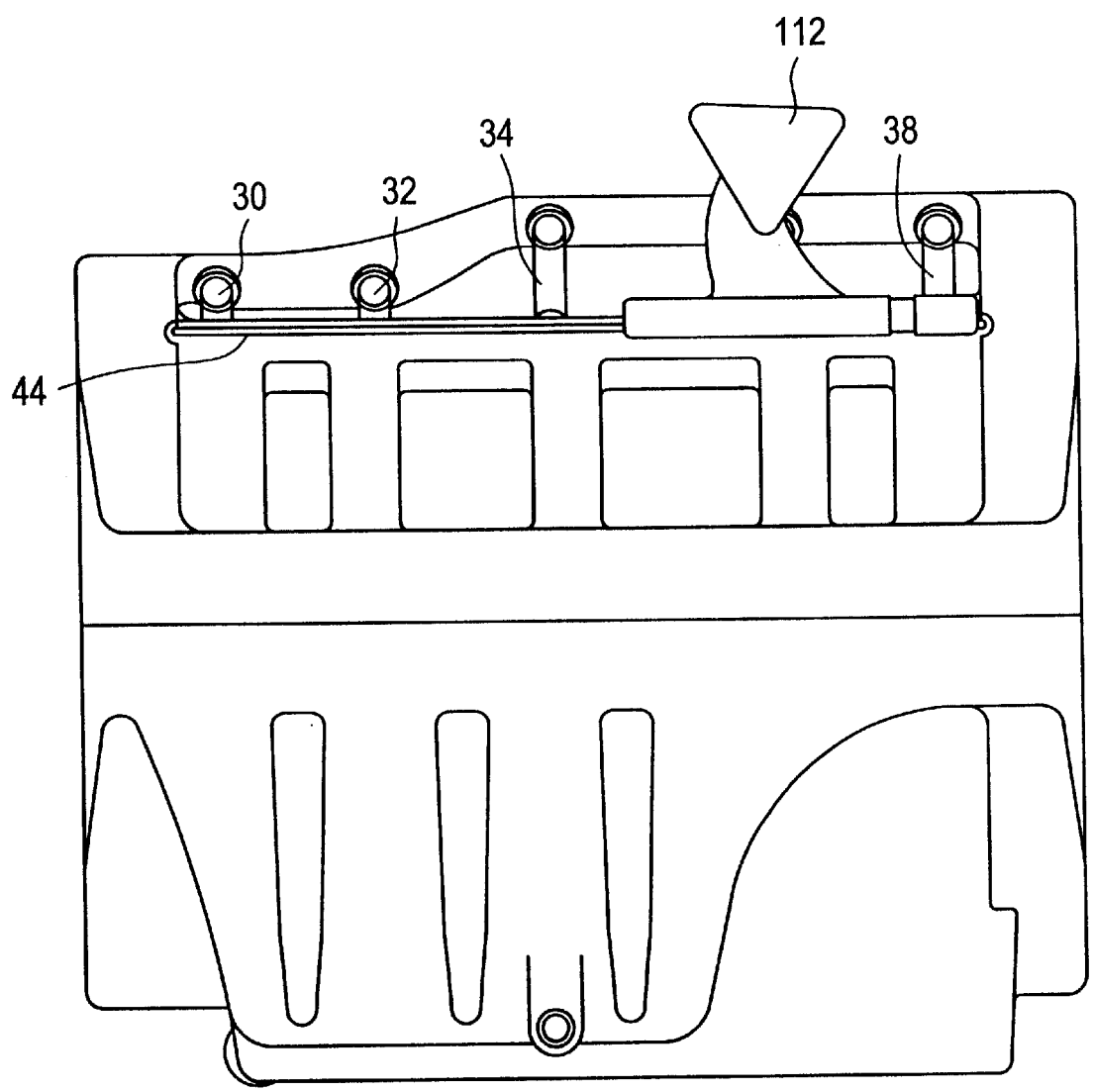
FIG. 12 is a left side view wherein the position of the reflecting mirror in the receiving coil unit in the apparatus shown in FIG. 1 has changed.

The vertical grids 22, 24 have mutually parallel rails 42, 44 with which the feet of the reflecting mirror 112 engage, it being possible to adjust the position of the reflecting mirror 112 in the up/down direction along these rails 42, 44. FIG. 12 shows the state where the reflecting mirror 112 is in its lowest position. In this way, the position of the reflecting mirror 112 can always be adjusted to eye height regardless of the build of the imaging subject housed inside the envelope.

Figure 15:
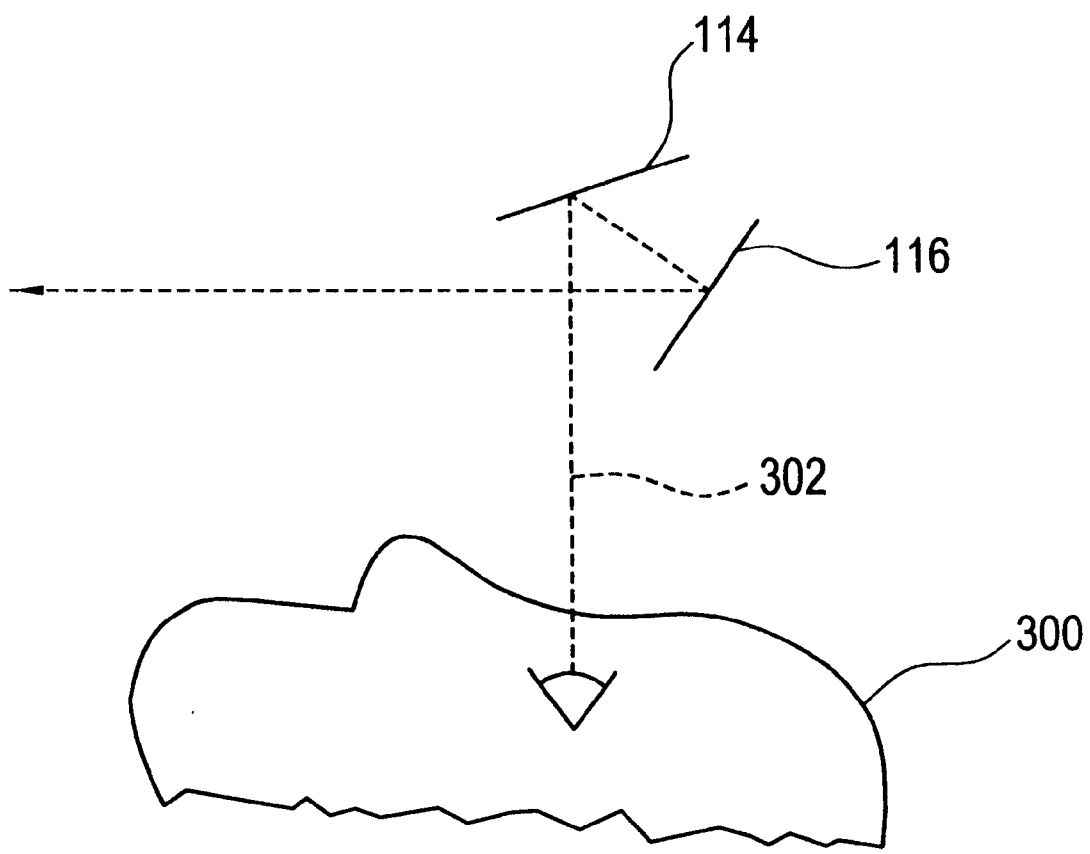
FIG. 15 is a schematic view showing the function of the reflecting mirror attached to the receiving coil unit in the apparatus shown in FIG. 1.

When the position is at eye height, the line of sight 302 of the imaging subject 300 is respectively reflected by two mirrors 114, 116 attached to the reflecting mirror 112 so that it points downwards, as shown in FIG. 15. Hence, eye contact with a care worker in this direction can be maintained.

Figure 13:
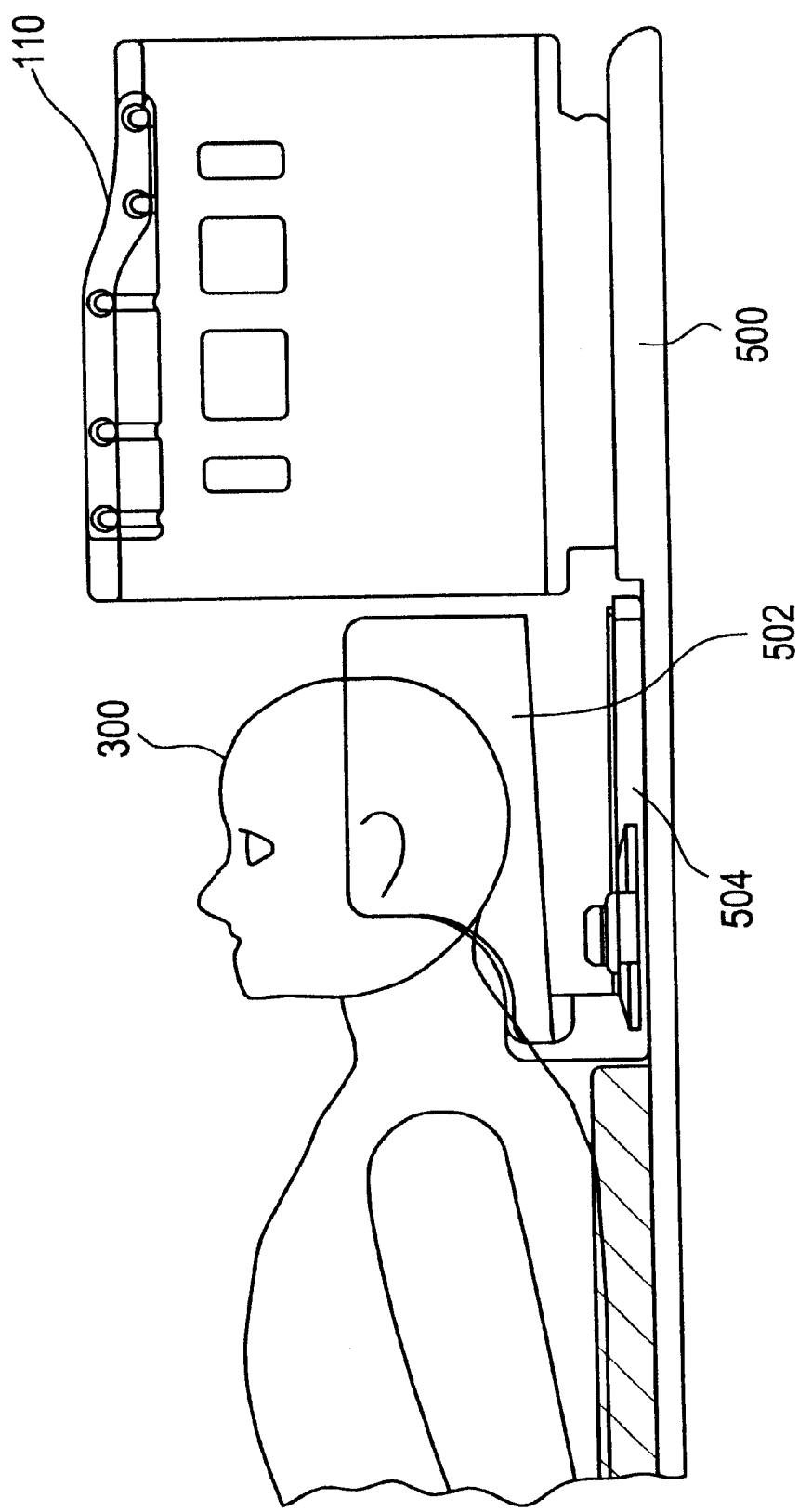
FIG. 13 is a schematic view showing a relation between the receiving coil unit and the imaging subject in the apparatus shown in FIG. 1.

When an image is taken, the imaging subject 300 lies down on the cradle 500 with his head on a headrest 502, as shown in FIG. 13. The headrest 502 is partly supported on the neck side of the imaging subject 300 by the base 504, and the headrest 502 and base 504 maintain a distance slightly larger than the height of the wall of the rear structure 90 of the receiving coil unit 110.

Figure 14:
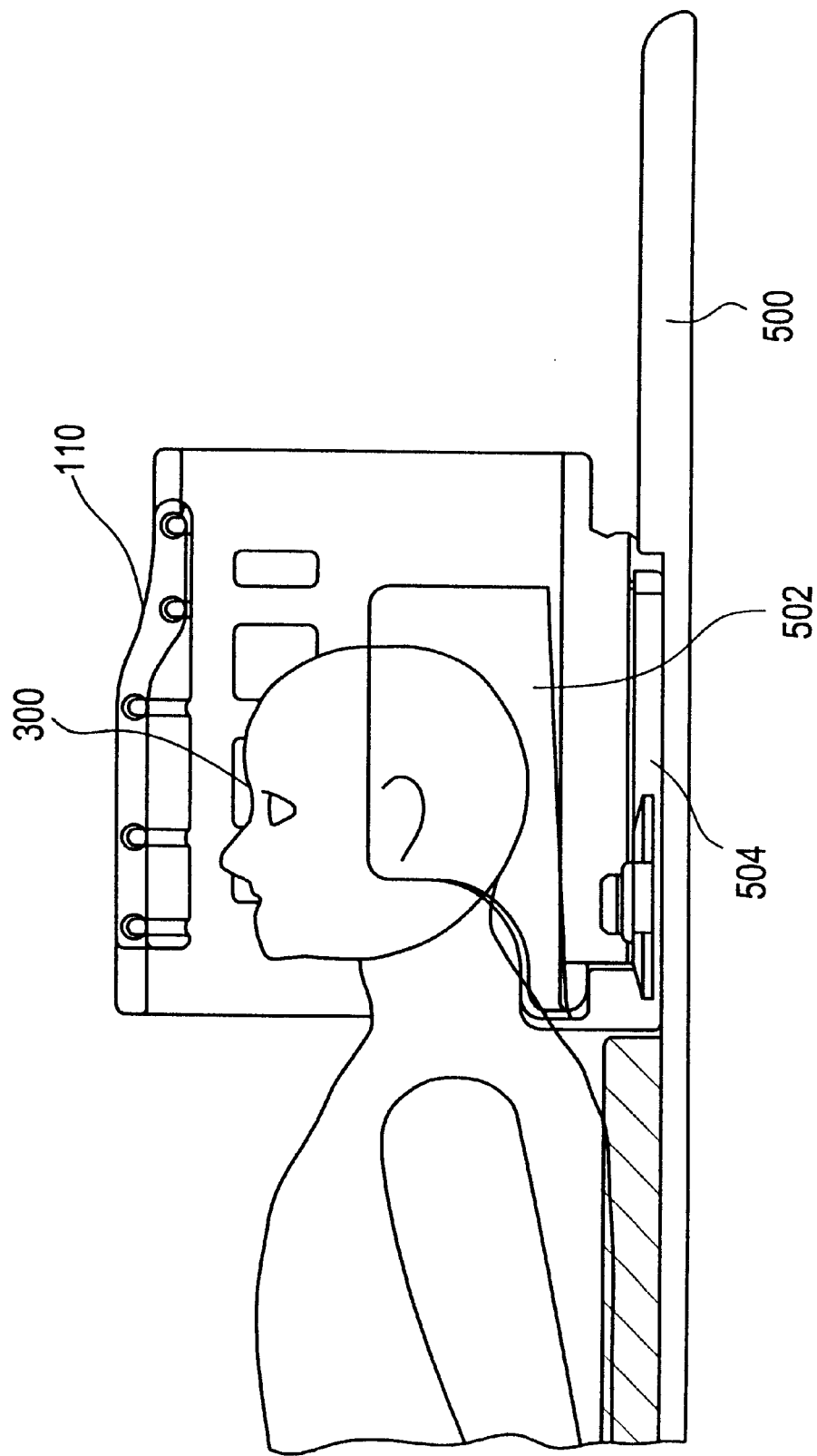
FIG. 14 is a schematic view showing a relation between the receiving coil unit and the imaging subject in the apparatus shown in FIG. 1.

Therefore, the coil receiving unit 110 is mounted on the cradle 500 so that its front surface faces the top of the head of the imaging subject 300, and the head of the imaging subject 300 can be accommodated in the internal space of the coil receiving unit 110 together with the headrest 502 by sliding the coil receiving unit 110 from this state towards the imaging subject 300, as shown in FIG. 14.

The cross-sectional surface perpendicular to the axis of the coil receiving unit 110 has a shape such that part of the circle projects forward from the front surface side edge by more than about half the distance in the axial direction, so the whole of the head can be accommodated in the coil receiving unit 110 smoothly and safely without the nose of the imaging subject 300 catching. Further, after half the distance to the part corresponding to the top of the head, the circular cross-section is smaller than if there were no projecting part, so the signal can be received with a good SNR.

As the front structure 10 also has a grid shape, there is a greater feeling of openness for the imaging subject 300 housed inside. Moreover, the grid which passes in front of the face comprises a rod-shaped conductor of small width per unit surface area covered by a transparent material, so there is less interference with the visual field. Also, more outside light enters, so brightness in the envelope increases which gives a desirable psychological effect to the imaging subject 300. Further, there is an opening on both sides of the screen, so openness is increased, air flow improves and there is no build up of heat due to body temperature.

The action of this apparatus will now be described. The action of this apparatus is performed under the control of the control unit 160. FIGS. 16(A)–16(E) show an example of a pulse sequence used for magnetic resonance imaging. This pulse sequence is a pulse sequence in the spin echo (SE) method.

Specifically, FIG. 16(A) is a 90 degree pulse or 180 degree pulse sequence used for RF excitation in the SE method, and FIGS. 16(B)–16(E) are likewise slice gradient Gs, read-out gradient Gr, phase encode gradient Gp and spin echo MR sequences respectively. The 90 degree pulse and 180 degree pulse are respectively represented by the center signal. The pulse sequence advances from left to right along the time axis t.

As shown in the figure, a 90 degree spin excitation is performed by the 90 degree pulse. The slice gradient Gs is then applied, and selective excitation is performed for a predetermined slice. After a predetermined time has elapsed from 90 degree excitation, 180 degree excitation, i.e., spin inversion, takes place due to the 180 degree pulse. The slice gradient Gs is also applied at this time, and selective inversion takes place for the same slice.

The read-out gradient Gr and phase encode gradient Gp are applied in the interval between the 90 degree excitation and spin inversion. Due to the read-out gradient Gr, spin dephase takes place. Due to the phase encode gradient Gp, spin phase encode takes place.

After spin inversion, the spin is rephased by the read-out gradient Gr and generates a spin echo MR. The spin echo MR is an RF signal having a waveform which is symmetrical about the echo center. The center echo is generated from 90 degrees excitation to after a TE (echo time). The spin echo MR is collected as view data by the data collecting unit 150. This pulse sequence is repeated 64 to 512 times in a period TR (repetition time) Each time it is repeated, the phase encode gradient Gp is modified and different phase encoding is performed on each occasion. Consequently, view data are obtained for 64 to 512 views.

FIGS 17(A)–17(E) show another example of a magnetic resonance imaging pulse sequence. This pulse sequence is a pulse sequence in the gradient echo (GRE) method.

Figures 17A, 17B, 17C, 17D, 17E:
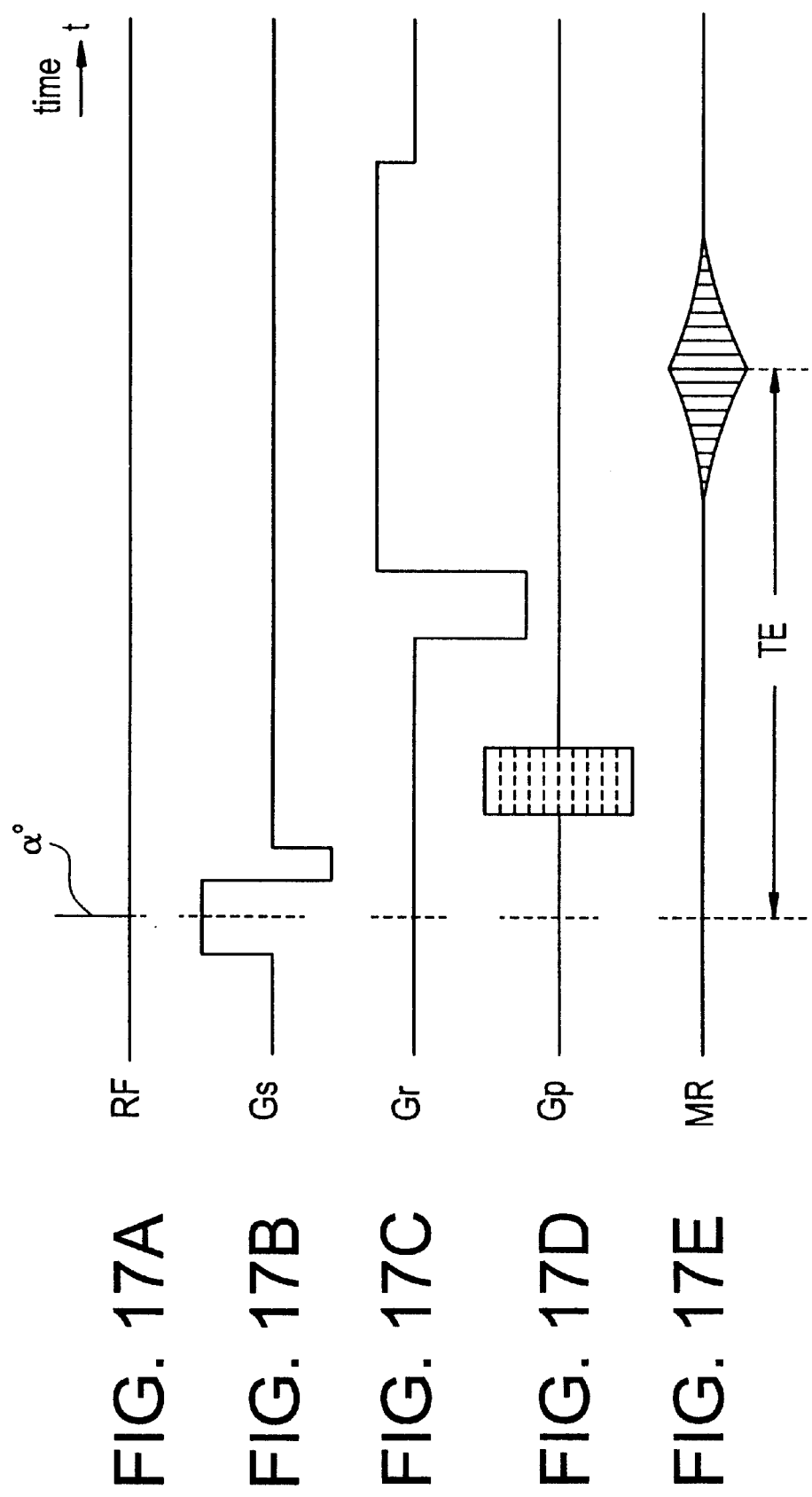
FIGS. 17(A)–17(E) are diagrams showing an example of a pulse sequence performed by the apparatus shown in FIG. 1.

Specifically, FIG. 17(A) is an α degree pulse sequence used for RF excitation in the GRE method, and FIGS. 17(B)–17(E) are likewise slice gradient Gs, read-out gradient Gr, phase encode gradient Gp and spin echo MR sequences respectively. The α degree pulse is represented by the center signal. The pulse sequence advances from left to right along the time axis t.

As shown in the figure, α degree spin excitation is performed by the α degree pulse. α is equal to or less than 90 degrees. The slice gradient Gs is then applied, and selective excitation is performed for a predetermined slice.

After α degree excitation, spin phase encode takes place due to the phase encode gradient Gp. Next, the spin is first dephased by the read-out gradient Gr, and the spin is then rephased to generate the gradient echo MR. The gradient echo MR is an RF signal having a waveform which is symmetrical about the echo center. The center echo is generated after TE from α degree excitation.

The gradient echo MR is collected as view data by the data collecting unit 150. This pulse sequence is repeated 64 to 512 times in the period TR. Each time it is repeated, the phase encode gradient Gp is modified and different phase encoding is performed on each occasion. Consequently, view data are obtained for 64 to 512 views.

The view data obtained by the pulse sequence of FIGS. 16(A)–16(E) or FIGS. 17(A)–17(E) is collected in a memory of the data processing unit 170. The pulse sequence is not limited to the SE method or GRE method, and may of course be that of any other suitable method such as for example the fast spin echo (FSE) method.

As the receiving coil unit 110 has the aforesaid construction, a received signal with good SNR can be obtained. The data processing unit 170 performs a two-dimensional inverse Fourier transformation on the view data to reconstruct a tomogram of the imaging subject 300. As the SNR of the received signal is good, a high-quality image can be obtained. The reconstructed image is displayed as a visible image by the display unit 180.

Many widely different embodiments of the invention may be configured without departing from the spirit and the scope of the present invention. It should be understood that the present invention is not limited to the specific embodiments described in the specification, except as defined in the appended claims.

What is claimed is:

1. An RF coil comprising:
    a plurality of first coil loops having a substantially cylindrical shape to encase the forehead of a subject being imaged and coaxially disposed from one end side to a center part of the axial direction of a space housing said imaging subject;
    a plurality of second coil loops having a part projecting in a direction effectively perpendicular to said axial direction and coaxially disposed from another end side to the center part, said part projecting at a distance sufficient to enclose a nose of said subject;
    wherein the length of said first coil loops is shorter than the length of said second coil loops so that the signal-to-noise ratio is improved as a result of the distances between the first coil loops and the forehead and between the second coil loops being generally similar; and
    a supporting frame supporting said first and second coil loops in one piece, whereof at least the other end side in said axial direction is open.

2. The RF coil of claim 1, wherein said supporting frame houses the head of an imaging subject introduced from the other end side in said axial direction.

3. The RF coil of claim 1, wherein said first and second coil loops are formed using a rod-shaped conductor whereof parts arranged in said direction are not covered by said supporting frame except the parts at the two ends in said axial direction.

4. The RF coil of claim 3, wherein said rod-shaped conductor comprises a transparent coating.

5. The RF coil of claim 3, wherein, in said first and second oil loops, conductor parts apart from said rod-shaped conductor are foil-shaped conductors.

6. The RF coil of claim 5, wherein said foil-shaped conductors are sealed inside said supporting frame.

7. The RF coil of claim 1, wherein: said supporting frame comprises an opening in a direction effectively perpendicular to said axial direction and said direction.

8. The RF coil of claim 1, further comprising a reflecting mirror attached to said supporting frame.

9. The RF coil of claim 8, wherein said reflecting mirror is bent by effectively 90 degrees in the direction of the line of sight.

10. The RF coil of claim 8, wherein the position of said reflecting mirror can be varied in said axial direction.

11. A magnetic resonance signal measuring apparatus comprising:
    a plurality of first coil loops having a substantially cylindrical shape to enclose the forehead of a subject being imaged and coaxially disposed from one end side to a center part in the axial direction of a space housing said imaging subject;
    a plurality of second coil loops having a part projecting in a direction effectively perpendicular to said axial direction and coaxially disposed from another end side to the center part, said part projecting at a distance sufficient to enclose a nose of said subject;
    wherein the length of said first coil loops is shorter than the length of said second coil loops so that the signal-to-noise ratio is improved as a result of the distances between the first coil loops and the forehead and between the second coil loops being generally similar;
    a supporting frame supporting said first and second coil loops in one piece, whereof at least the other end side in said axial direction is open; and
    magnetic resonance signal measuring means connected to said coil loops.

12. The magnetic resonance signal measuring apparatus of claim 11, wherein said supporting frame houses the head of an imaging subject introduced from the other end side in said axial direction.

13. The magnetic resonance signal measuring apparatus of claim 11, wherein said first and second coil loops are formed using a rod-shaped conductor whereof parts arranged in said direction are not covered by said supporting frame except the parts at the two ends in said axial direction.

14. The magnetic resonance signal measuring apparatus of claim 11, wherein said supporting frame comprises an opening in a direction effectively perpendicular to said axial direction and said direction.

15. The magnetic resonance signal measuring apparatus of claim 11, further comprising a reflecting mirror attached to aid supporting frame.

16. A magnetic resonance imaging apparatus comprising:

static magnetic field forming means which forms a static magnetic field in a space housing an imaging object;

gradient magnetic field forming means which forms a gradient magnetic field in said space;

high frequency magnetic field forming means which forms a high frequency magnetic field in said space;

a plurality of first coil loops having a substantially cylindrical shape to enclose the forehead of a subject being imaged and coaxially disposed from one end side to a center part in the axial direction of said space housing said imaging subject;

a plurality of second coil loops having a part projecting in a direction effectively perpendicular to said axial direction and coaxially disposed from another end side to the center part, said part projecting at a distance sufficient to enclose a nose of said subject;

wherein the length of said first coil loops is shorter than the length of said second coil loops so that the signal-to-noise ratio is improved as a result of the distances between the first coil loops and the forehead and between the second coil loops being generally similar;

a supporting frame supporting said first and second coil loops in one piece, whereof at least the other end side in said axial direction is open, magnetic resonance signal measuring means connected to said coil loops; and image-generating means which generates an image based on the magnetic resonance signal measured by said magnetic resonance signal measuring means.

17. The magnetic resonance imaging apparatus of claim 16, wherein said supporting frame houses the head of an imaging subject introduced from the other end side in said axial direction.

18. The magnetic resonance imaging apparatus of claim 16, wherein said first and second coil loops are formed using a rod-shaped conductor whereof parts arranged in said direction are not covered by said supporting frame except the parts at the two ends in said axial direction.

19. The magnetic resonance imaging apparatus of claim 16, wherein: said supporting frame comprises an opening in a direction effectively perpendicular to said axial direction and said direction.

20. The magnetic resonance imaging apparatus of claim 16, comprising a reflecting mirror attached to said supporting frame.

* * * * *